United States Patent
Liao

(10) Patent No.: US 6,214,659 B1
(45) Date of Patent: Apr. 10, 2001

(54) METHOD TO CROWN CAPACITOR FOR HIGH DENSITY DRAM

(75) Inventor: Kuan-Yang Liao, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/237,207

(22) Filed: Jan. 25, 1999

(30) Foreign Application Priority Data

Sep. 22, 1998 (TW) .................................................. 87115742

(51) Int. Cl.⁷ ............................................... H01L 21/8242
(52) U.S. Cl. .................... 438/239; 438/253; 438/396; 438/671; 438/717; 438/950
(58) Field of Search .................. 216/6; 257/306, 257/307, 308; 438/239, 253, 254, 255, 256, 396, 397, 398, 399, 671, 717, 736, 942, 950, 952

(56) References Cited

U.S. PATENT DOCUMENTS

| | | | |
|---|---|---|---|
| 5,127,987 | * 7/1992 | Okudaira et al. ..................... | 437/717 |
| 5,407,529 | * 4/1995 | Homma ................................. | 438/671 |
| 5,871,886 | * 2/1999 | Yu et al. .............................. | 430/316 |
| 6,124,162 | * 9/2000 | Lin ....................................... | 438/238 |

OTHER PUBLICATIONS

Wolf et al., "Lithography I: Optical Resist Materials and Process Technology", Silicon Processing for the VLSI Era, vol. 1—Process Technology (pp. 427–428), 1986.*

* cited by examiner

Primary Examiner—Carl Whitehead, Jr.
Assistant Examiner—Toniae M. Thomas
(74) Attorney, Agent, or Firm—Jiawei Huang; J.C. Patents

(57) ABSTRACT

A method for fabricating a crown capacitor is able to form a deep UV photoresist layer having a cylindrical structure by using only one mask. A conductive layer, the main structure of a bottom electrode, is formed on the sidewall of the deep UV photoresist layer by performing a silylation process. A fairly small and high cylindrical structure is formed by the invention, so that the crown capacitor can be used in DRAM having a storage capacity higher than 64 MB. Also, there is no problem of registration because only one mask is used.

23 Claims, 4 Drawing Sheets

METHOD TO CROWN CAPACITOR FOR HIGH DENSITY DRAM

CROSS-REFERENCE TO RELATED APPLICATION

This application claims the priority benefit of Taiwan application serial no. 87115742, filed Sep. 22, 1998, the full disclosure of which is incorporated herein by reference.

BACKGROUND OF THE INVENTION

1. Field of the Invention

The present invention relates to a method of fabricating a capacitor. More particularly, the present invention relates to a method for fabricating a crown capacitor used in DRAM.

2. Description of the Related Art

In conventional DRAM having a storage capacity less than 1 MB, it is a customary practice to use a two-dimensional capacitor called a planar-type capacitor as the data storage capacitor. One drawback in the planar-type capacitor, however, is that it requires quite a large chip area to implement. Therefore, the planar-type capacitor is not suitable for high-integration DRAM. In DRAM having a storage capacity higher than 4 MB, a three-dimensional capacitor such as a stacked-type capacitor is used as the data storage capacitor. A crown capacitor is a kind of stacked-type capacitor.

FIGS. 1A through 1C are schematic, cross-sectional diagrams used to depict the steps in conventional method for fabricating a crown capacitor Referring to FIG. 1A, a substrate 20 having a MOS structure is provided, wherein the MOS structure includes a drain region 24. An inter-layer dielectric layer 26 is formed on the substrate 20. A contact hole 28 is formed in the inter-dielectric layer 26 to expose the drain region 24. A conductive layer 30 is formed on the inter-layer dielectric layer 26 and fills the contact hole 28. The thickness of the conductive layer 30 on the inter-layer dielectric layer 26 is about 6000 Å.

Referring to FIG. 1B, an opening 32 is formed in the conductive layer 30 and corresponds to the contact hole 28. The step of forming the opening 32 includes performing an anisotropic etching process to remove a portion of the conductive layer 30 by controlling the duration of etching. The depth of etching is about 4000 to 5000 Å.

Referring to FIG. 1C, an anisotropic etching process is performed to remove a portion of the conductive layer 30 by using the inter-layer dielectric layer 26 as a stop layer. Therefore, a bottom electrode 34 is made from the remaining conductive layer 30. A dielectric layer 36 is formed on the bottom electrode 34 and an upper electrode 38 is formed on the dielectric layer 36.

In conventional process for fabricating DRAM whose channel length is below 0.35 μm, two masks are used to form the bottom electrode of the crown capacitor. As the integration of DRAM is increased, the critical dimension of the crown capacitor is reduced. It is hard to meet the demands of the critical dimension of the crown capacitor by using conventional process, because the tolerance of the registration between the two masks is reduced.

SUMMARY OF THE INVENTION

Accordingly, the present invention provides a method for fabricating a crown capacitor useing only one mask to meet the demand of the critical dimension of the crown capacitor.

To achieve these and other advantages and in accordance with the purpose of the invention, as embodied and broadly described herein, the invention provides a method for fabricating a crown capacitor. The method for fabricating this crown capacitor includes the following steps. A substrate having a MOS structure is provided. The MOS structure includes a drain region. An inter-layer dielectric layer is formed on the substrate. A contact hole is formed in the inter-layer dielectric layer to expose the drain region. A first conductive layer is formed on the inter-layer dielectric layer and fills the contact hole. A first, deep UV photoresist layer and a hard mask layer are formed in sequence on the first conductive layer. A second, deep UV photoresist layer is formed on a portion of the hard mask layer and corresponding to the contact hole. A portion of the hard mask layer is removed. The second deep UV photoresist layer and a portion of the first deep UV photoresist layer are removed. A second, conductive layer is formed on the sidewall of the first, deep UV photoresist layer by performing a silylation process. A portion of the first conductive layer exposed by the first, deep UV photoresist layer and the second conductive layer is removed by performing an anisotropic etching process, and a portion of the top of the second conductive layer is removed in the same step. A bottom electrode of the crown capacitor is made from the remaining first conductive layer and the remaining second conductive layer. Then, the hard mask layer and the remaining first, deep UV photoresist layer are removed in sequence. A dielectric layer is formed on the bottom electrode. Finally, an upper electrode is formed on the dielectric layer.

To achieve these and other advantages and in accordance with the purpose of the invention, as embodied and broadly described herein, the invention provides another method for fabricating a crown capacitor. The method for fabricating this crown capacitor includes the following steps. A substrate having a MOS structure is provided, wherein the MOS structure includes a drain region. An inter-layer dielectric layer is formed on the substrate. A contact hole is formed in the inter-layer dielectric layer to expose the drain region. A first conductive layer is formed on the inter-layer dielectric layer and fills the contact hole. A deep UV photoresist layer is formed on the first conductive layer. The deep UV photoresist layer is patterned, thus the remaining deep UV photoresist layer having cylindrical structure corresponds to the contact hole. A second conductive layer is formed on the top and the sidewall of the remaining deep UV photoresist layer by performing a silylation process. A portion of the first conductive layer exposed by the second conductive layer and the deep UV photoresist layer is removed, and a portion of the second conductive layer is removed in the same step. A bottom electrode of the crown capacitor is made from the remaining first conductive layer and the remaining second conductive layer. Then, the remaining deep UV photoresist layer is removed. A dielectric layer is formed on the bottom electrode. An upper electrode is formed on the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
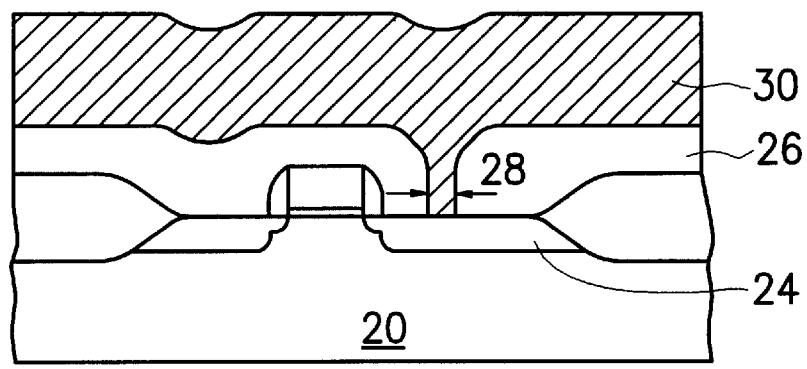
FIGS. 1A through 1C are schematic, cross-sectional diagrams used to depict steps in conventional method for fabricating a crown capacitor.
Figure 1B:
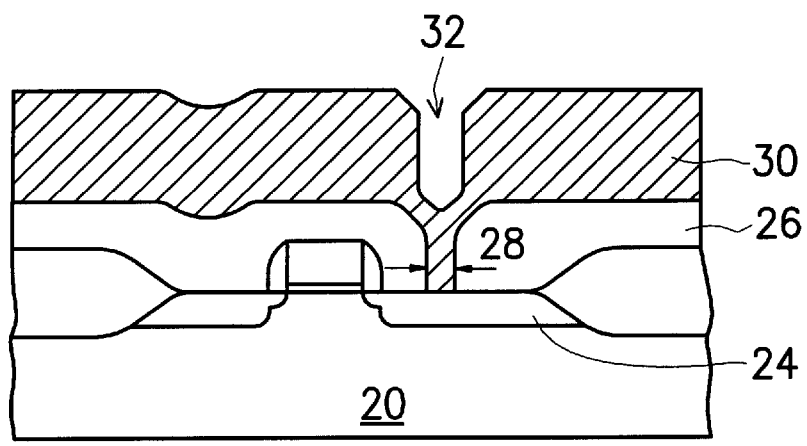
Figure 1C:
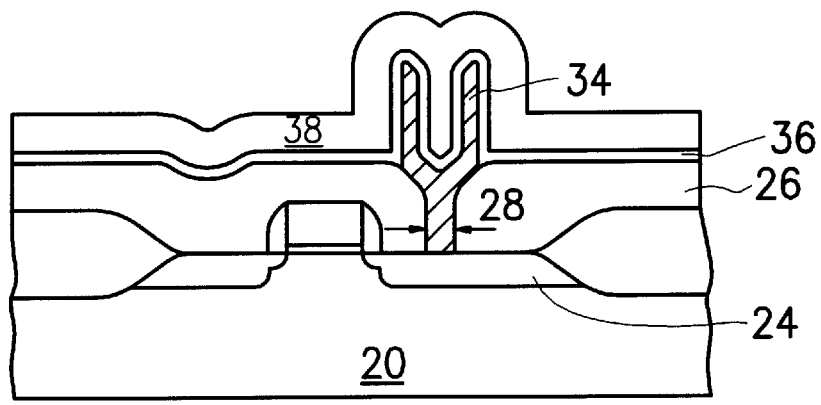

Reference will now be made in detail to the present preferred embodiments of the invention, examples of which are illustrated in the accompanying drawings. Wherever possible, the same reference numbers are used in the drawings and the description to refer to the same or like parts.

The invention provides a new fabricating method for a crown capacitor as shown in FIGS. 2A through 2D.

Figure 2A:
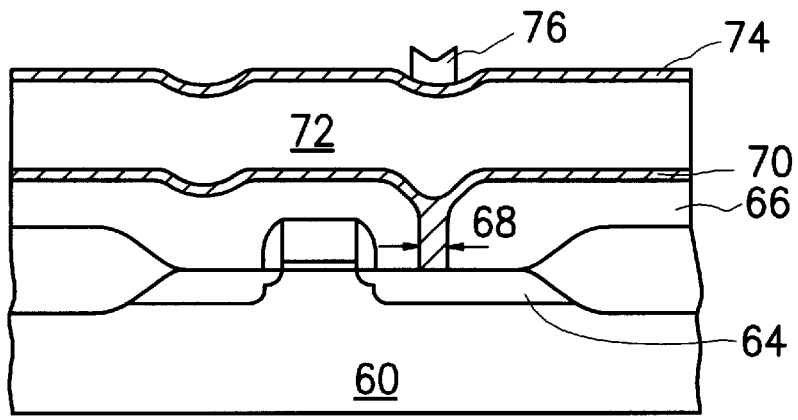
FIGS. 2A through 2D are schematic, cross-sectional diagrams used to depict steps in a method according to the invention for fabricating a crown capacitor.

Referring to FIG. 2A, a substrate 60 having a MOS structure is provided, wherein the MOS structure includes a drain region 64. An inter-layer dielectric layer 66 is formed on the substrate 60. A contact hole 68 is formed in the inter-layer dielectric layer 66 to expose the drain region 64. A conductive layer 70 is formed on the inter-layer dielectric layer 66 and fills the contact hole 68. Preferably, the thickness of the conductive layer 70 on the inter-layer dielectric layer 66 is about 1000 to 2000 Å. A deep UV photoresist layer 72 is formed on the conductive layer 70. A hard mask layer 74 is formed on the deep UV photoresist layer 72. The hard mask layer 74 includes silicon oxide or silicon nitride formed by plasma enhanced chemical vapor deposition. Moreover, the step of forming the hard mask layer 74 includes performing a silylation process to form a silicon layer on the deep UV photoresist layer 72 and then performing a plasma oxidation process to transform the silicon layer into a silicon oxide layer. A deep UV photoresist layer 76 is formed on the hard mask layer 74 at a location corresponding to the contact hole 68. The step of forming the deep UV photoresist layer 76 includes coating a thin deep UV photoresist layer over the hard mask layer 74 and then removing a portion of the thin deep UV photoresist layer. The remaining portion of the thin deep UV photoresist layer which forms the deep UV photoresist layer 76 is aligned with the contact hole 68. The dimension, shape, and planar area of the deep UV photoresist layer 76 can be controlled by choosing proper processing conditions.

Figure 2B:
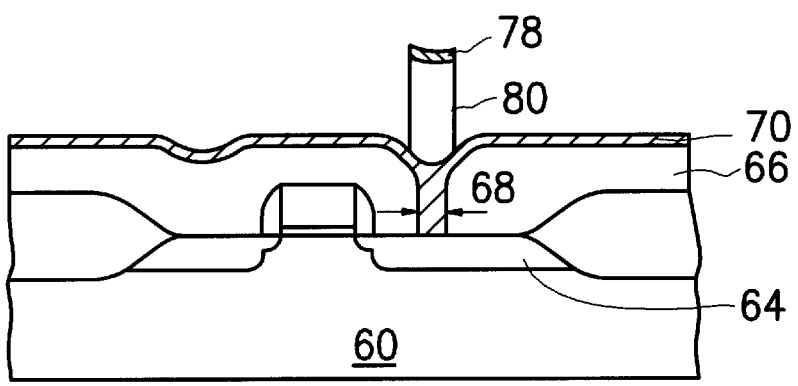

Referring to FIG. 2B, a hard mask layer 78 is formed. The step of forming the hard mask layer 78 includes performing a dry etching process to remove a portion of the hard mask layer 74 exposed by the deep UV photoresist layer 76. The remaining portion of the hard mask layer 74 forms the hard mask layer 78. A deep UV photoresist layer 80 having cylindrical structure is formed by using the hard mask layer 78 as a mask. The step of forming the deep UV photoresist layer 80 includes performing an etching process such as oxygen plasma etching to remove the deep UV photoresist layer 76 and a portion of the deep UV photoresist layer 72 exposed by the mask layer 78. The remaining portion of the deep UV photoresist layer 72 forms the deep UV photoresist layer 80.

Figure 2C:
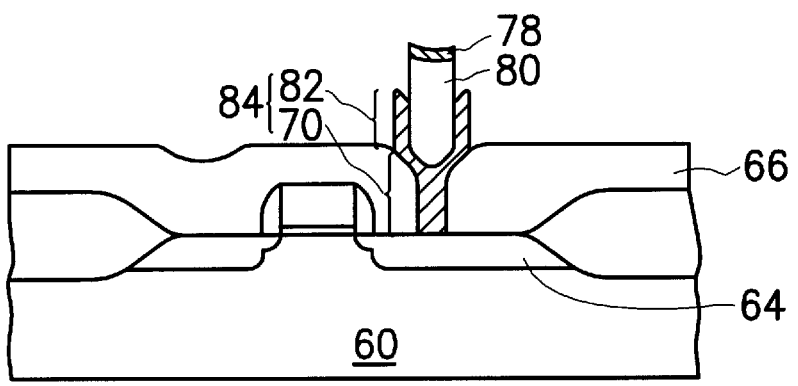

Referring to FIG. 2C, a conductive layer 82 is formed on the sidewall of the deep UV photoresist layer 80 by performing a silylation process. The inter-layer dielectric layer 66 is used as a stop layer. A dry etching process such as an anisotropic etching process is performed to remove a portion of the conductive layer 70 exposed by the deep UV photoresist layer 80 and the conductive layer 82. In the same step, a portion of the top of the conductive layer 82 is removed. Thus, a bottom electrode 84 of a crown capacitor is made from the remaining conductive layer 70 and the remaining conductive layer 82.

Figure 2D:
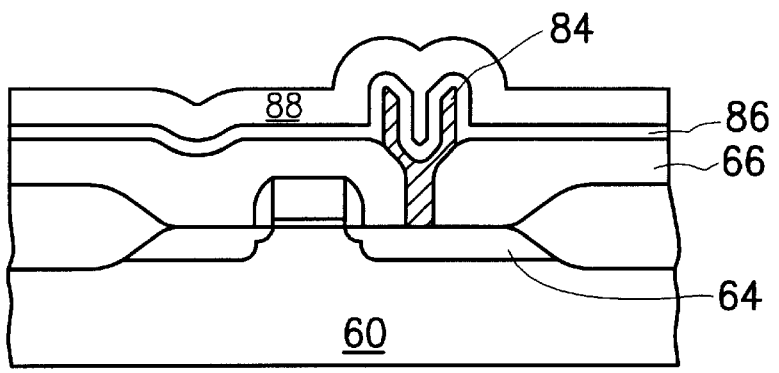

Referring to FIG. 2D, the hard mask layer 78 is removed, and the deep UV photoresist layer 80 is removed by dry etching or wet etching. A dielectric layer 86 is formed on the bottom electrode 84 and an upper electrode 88 is formed on the dielectric layer 86.

The invention provides another new fabricating method for a crown capacitor as shown in FIGS. 3A through 3E.

Figure 3A:
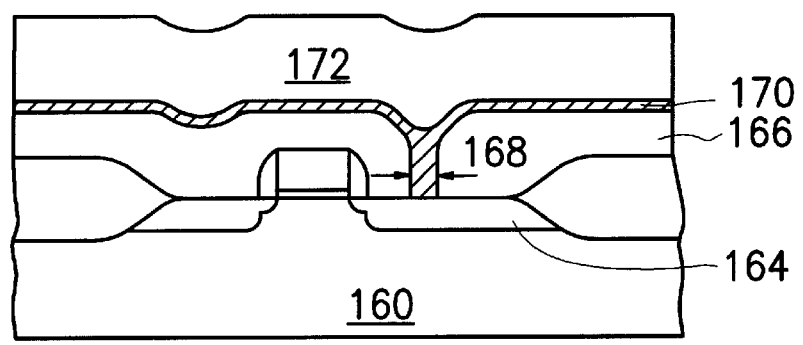
FIGS. 3A through 3E are schematic, cross-sectional diagrams used to depict steps in another method according to the invention for fabricating a crown capacitor.

Referring to FIG. 3A, a substrate 160 having a MOS structure is provided, wherein the MOS structure includes a drain region 164. An inter-layer dielectric layer 166 is formed on the substrate 160. A contact hole 168 is formed in the inter-layer dielectric layer 166 to expose the drain region 164. A conductive layer 170 is formed on the inter-layer dielectric layer 166 and fills the contact hole 168. The thickness of the conductive layer 170 on the inter-layer dielectric layer 166 is about 1000 to 2000 Å. A deep UV photoresist layer 172 is formed on the conductive layer 170.

Figure 3B:
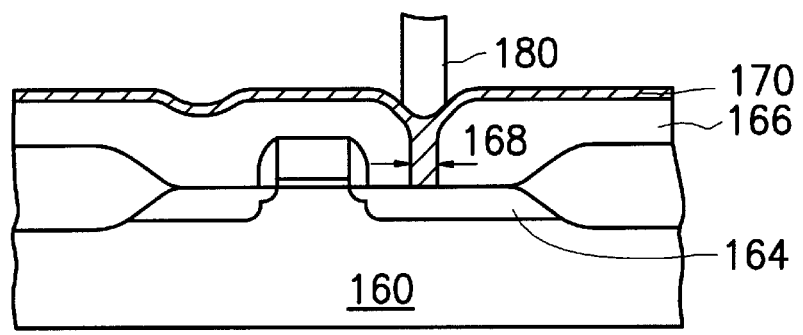

Referring to FIG. 3B, a portion of the deep UV photoresist layer 172 is removed by an anisotropic etching process. Thus, the remaining portion of the deep UV photoresist layer 172 forms the deep UV photoresist layer 180 aligned with the contact hole 168. The shape and dimension of the deep photoresist layer 180 can be controlled by adjusting the condition of the etching process. Preferably, the photoresist layer 180 has a cylindrical structure.

Figure 3C:
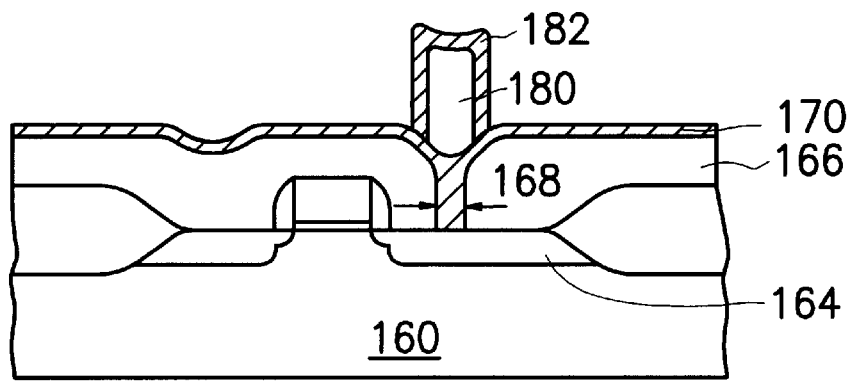
Figure 3D:
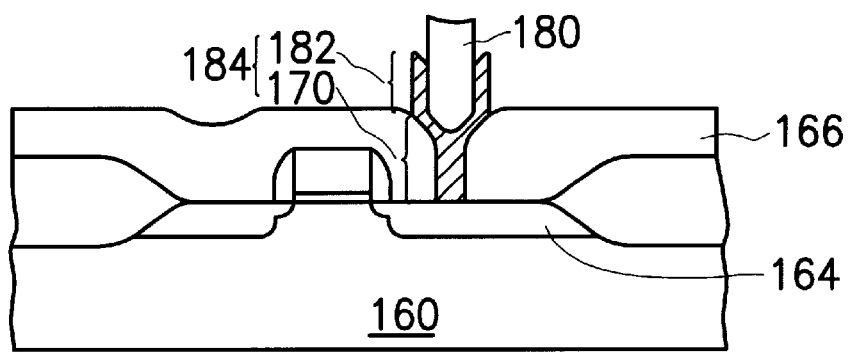

Referring to FIG. 3C, a conductive layer 182 is formed on the top and the sidewall of the deep UV photoresist layer 180 by performing a silylation process. Referring to FIG. 3D, the inter-layer dielectric layer 166 is used as a stop layer. An anisotropic etching process is performed to remove a portion of the conductive layer 170 exposed by the deep UV photoresist layer 180 and the conductive layer 182. A portion of the conductive layer 182 on the top of the deep UV photoresist layer 180 is also removed in the same step to expose the top surface of the photoresist layer 180. Thus, a bottom electrode 184 of a crown capacitor is made from the remaining conductive layer 170 and the remaining conductive layer 182.

Figure 3E:
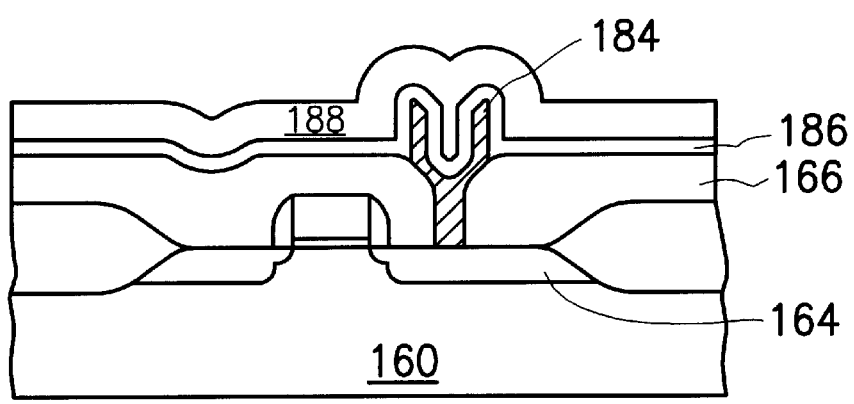

Referring to FIG. 3E, the deep UV photoresist layer 180 is removed by dry etching or wet etching. A dielectric layer 186 is formed on the bottom electrode 184 and an upper electrode 188 is formed on the dielectric layer 186.

According to the foregoing, only one mask is used in the invention to form the deep UV photoresist layer having cylindrical structure, thus the registration problem in conventional method is avoided and the process is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a crown capacitor, comprising the steps of:

providing a substrate having a MOS structure with a drain region;

forming an inter-layer dielectric layer on the substrate;

forming a contact hole in the inter-layer dielectric layer to expose the drain region;

forming a first conductive layer on the inter-layer dielectric layer to fill the contact hole;

forming a first, deep UV photoresist layer on the first conductive layer;

forming a hard mask layer on the first, deep UV photoresist layer;

forming a second, deep UV photoresist layer on the hard mask layer, wherein the second deep UV photoresist layer is positioned corresponding to the contact hole;

removing a portion of the hard mask layer exposed by the second, deep UV photoresist layer;

removing the second deep UV photoresist layer and a portion of the first, deep UV photoresist layer exposed by the remaining hard mask layer to expose the first conductive layer;

performing a silylation process to form a second conductive layer on sidewall of the remaining first, deep UV photoresist layer;

removing a portion of the first conductive layer exposed by the remaining first, deep UV photoresist layer and the second conductive layer, so that a bottom electrode is made from the remaining first conductive layer and the second conductive layer;

removing the remaining first, deep UV photoresist layer;

forming a dielectric layer on the bottom electrode; and forming an upper electrode on the dielectric layer.

2. The method of claim 1, wherein the thickness of the first conductive layer on the inter-layer dielectric layer is about 1000 to 2000 Å.

3. The method of claim 1, wherein the hard mask layer includes silicon oxide.

4. The method of claim 1, wherein the hard mask layer includes silicon nitride.

5. The method of claim 3, wherein the step of forming the hard mask layer includes plasma enhanced chemical vapor deposition.

6. The method of claim 4, wherein the step of forming the hard mask layer includes plasma enhanced chemical vapor deposition.

7. The method of claim 1, wherein the step of forming the hard mask layer includes performing a silylation process and a plasma oxidation process in sequence to form a silicon oxide layer on the first, deep UV photoresist layer.

8. The method of claim 1, wherein the step of removing a portion of the first, deep UV photoresist layer includes dry etching.

9. The method of claim 1, wherein the step of forming the bottom electrode includes performing a dry etching process by using the inter-layer dielectric layer as a stop layer.

10. The method of claim 1, wherein the step of removing a portion of the hard mask layer includes dry etching.

11. The method of claim 1, wherein the step of removing the remaining first, deep UV photoresist layer includes wet etching.

12. A method for fabricating a crown capacitor, comprising the steps of:

providing a substrate having a MOS structure with a drain region;

forming an inter-layer dielectric layer on the substrate;

forming a contact hole in the inter-layer dielectric layer to expose the drain region;

forming a first conductive layer on the inter-layer dielectric layer to fill the contact hole;

forming a first, deep UV photoresist layer on the first conductive layer;

forming a hard mask layer on the first, deep UV photoresist layer;

forming a second, deep UV photoresist layer on the hard mask layer, wherein the second deep UV photoresist layer partially covers the hard mask layer and is positioned corresponding to the contact hole;

removing a portion of the hard mask layer exposed by the second, deep UV photoresist layer;

removing the second deep UV photoresist layer and a portion of the first deep UV photoresist layer exposed by the remaining hard mask layer to expose the first conductive layer;

performing a silylation process to form a second conductive layer on sidewall of the remaining first, deep UV photoresist layer;

removing a portion of the first conductive layer exposed by the first, deep UV photoresist layer and the second conductive layer, so that a bottom electrode is made from the remaining first conductive layer and the second conductive layer.

13. The method of claim 12, wherein the thickness of the first conductive layer on the inter-layer dielectric layer is about 1000 to 2000 Å.

14. The method of claim 12, wherein the hard mask layer includes silicon oxide.

15. The method of claim 12, wherein the hard mask layer includes silicon nitride.

16. The method of claim 14, wherein the step of forming the hard mask layer includes plasma enhanced chemical vapor deposition.

17. The method of claim 15, wherein the step of forming the hard mask layer includes plasma enhanced chemical vapor deposition.

18. The method of claim 12, wherein the step of forming the hard mask layer includes performing a silylation process and a plasma oxidation process in sequence to form a silicon oxide layer on the first, deep UV photoresist layer.

19. The method of claim 12, wherein the step of removing a portion of the first, deep UV photoresist layer includes dry etching.

20. The method of claim 12, wherein the step of forming the bottom electrode includes performing a dry etching process by using the inter-layer dielectric layer as a stop layer.

21. The method of claim 12, wherein the step of removing a portion of the hard mask layer includes dry etching.

22. The method of claim 12, further comprising the steps of:

removing the remaining hard mask layer; and removing the remaining first, deep UV photoresist layer.

23. The method of claim 22, wherein the step of removing the remaining first, deep UV photoresist layer includes wet etching.

* * * * *